United States Patent [19]
Goldberger et al.

[11] Patent Number: 6,094,112
[45] Date of Patent: Jul. 25, 2000

[54] SURFACE MOUNT FILTER DEVICE

[75] Inventors: Haim Goldberger; Isaac Refaely, both of Modi'in; Ehud Elron, Jerusalem, all of Israel

[73] Assignee: AVX Corporation, Myrtle Beach, S.C.

[21] Appl. No.: 09/169,260

[22] Filed: Oct. 9, 1998

Related U.S. Application Data

[60] Provisional application No. 60/062,364, Oct. 15, 1997.

[51] Int. Cl.$^7$ ....................................................... H03H 7/00
[52] U.S. Cl. ........................................... 333/185; 333/184
[58] Field of Search ................................... 333/181, 184, 333/185

[56] References Cited

U.S. PATENT DOCUMENTS

| | | | |
|---|---|---|---|
| 4,302,737 | 11/1981 | Kausche et al. | 333/172 |
| 4,888,568 | 12/1989 | Kawaguchi | 333/174 |
| 5,225,969 | 7/1993 | Takaya et al. | 333/185 X |
| 5,363,080 | 11/1994 | Breen | 336/192 |
| 5,532,656 | 7/1996 | Yoshimura | 333/185 |

*Primary Examiner*—Justin P. Bettendorf
*Attorney, Agent, or Firm*—Dority & Manning, P.A.

[57] ABSTRACT

A surface mount filter device is provided having a device body with a plurality of terminations located thereon. Capacitors and inductors are located on the same chip to create a variety of LC filters, such as LPF, HPF, BPF and BRF, or combinations of these options, as well as LC resonator structures. The chip is preferably built by thin film technology, which allows a considerable reduction in component or circuit size. The device body is constructed having a rigid insulative substrate to which a first conductive pattern having one or more first capacitor plates is applied. A dielectric is located over the first conductive pattern, and itself supports a second conductive pattern defining the opposed capacitor plates. One or more layers of insulative polymer are located above the dielectric layer, and have conductor channels in which conductive material is located. The conductive material in the conductive channels forms the coil of the on-chip inductor. A sealing cover, such as glass or a planar polymeric sheet, is located above the polymeric insulative layers.

14 Claims, 12 Drawing Sheets

PAD I

DIELECTRIC

PAD II

POLY I

PAD III

POLY II

PAD I

DIELECTRIC

PAD II

POLY I

POLY II

PAD III

PAD II

POLY I

POLY VIA

PAD III
(PLUS POLY PAD III
SAME PATTERN)

SURFACE MOUNT FILTER DEVICE

CROSS-REFERENCE TO A RELATED APPLICATION

This application is based on a Provisional Application filed Oct. 15, 1997 and having Ser. No. 60/062,364.

BACKGROUND OF THE INVENTION

The present invention relates generally to small electronic components adapted to be surface mounted on a larger circuit board. More particularly, the invention relates to a surface mount filter device for use in a variety of applications.

Surface mount components are often rectangular, and very small. For example, the component may have length and width dimensions of less than 1/10 of an inch. Generally speaking, the component body will include side terminations compatible with mass production soldering techniques.

As known by those skilled in the art, filters are often created by various combinations of electronic components. The components may be discrete, or combined on a chip. The component values, and their arrangement, determines the frequencies that are passed by the filter. For example, low pass filters (LPF), high pass filters (HPF), band pass filters (BPF) and band reject filters (BRF) can be made in this manner.

A need exists for novel filter devices that are compatible with surface mount techniques.

SUMMARY OF THE INVENTION

The present invention recognizes various disadvantages of prior art constructions and methods. Accordingly, it is an object of the present invention to provide novel surface mount components.

It is a more particular object of the present invention to provide various novel structures for a surface mount filter device.

It is a further object of the present invention to provide small filter devices particularly adapted for use in various applications.

It is also an object of the present invention to provide novel methodology for the production of a filter device.

Some of these objects are achieved by a surface mount filter device comprising a device body having a plurality of electrical terminations located thereon. The device body includes an insulating substrate having a top surface and a bottom surface. At least one first conductive pattern in the form of a first capacitor plate is defined on a top surface of the substrate. A dielectric layer is located on top of the conductive pattern. A second conductive pattern, defining at least one second capacitor plate in registry with said first capacitor plate, is located on the dielectric layer. The second conductive pattern further defines at least a portion of an inductor coil.

In exemplary embodiments, one or more layers of insulative polymer, such as polyimide, are located above the dielectric layer. The insulative layers preferably define a conductor channel in registry with the portion of the inductor coil of the second conductor pattern. A conductor located in the conductor channel completes the inductor coil, and/or enhances its thickness to a desired value. An insulative cover layer, which may be a polymeric sheet material or a rigid insulative material depending on the embodiment, is preferably disposed above the insulative layers.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
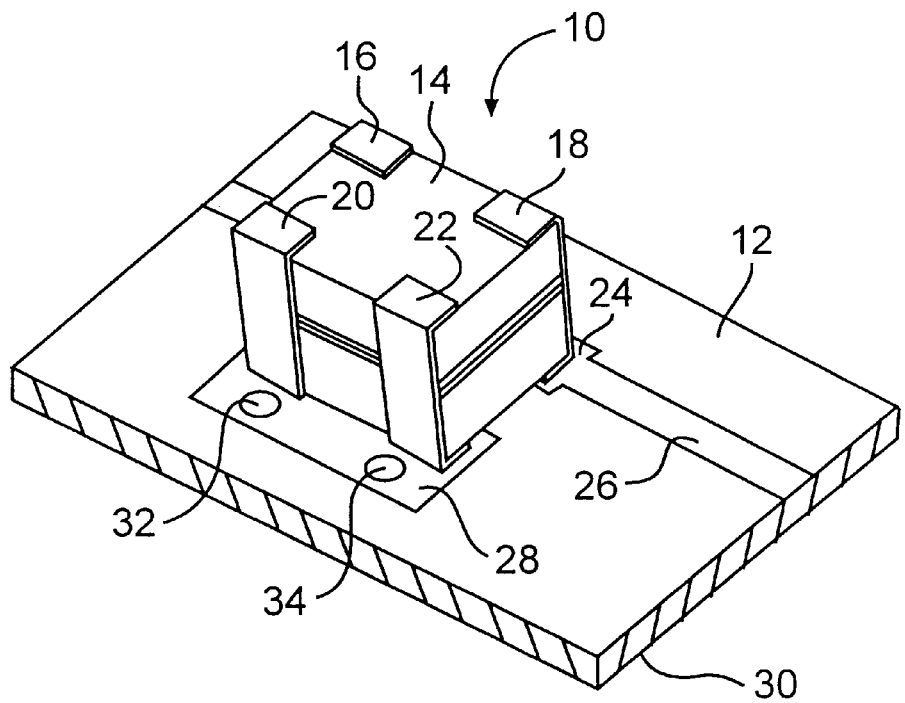
FIG. 1 is a diagrammatic representation showing a filter device of the present invention installed on a circuit board as it may appear in use.

Repeat use of reference characters in the present specification and drawings is intended to represent same or analogous features or elements of the invention.

DETAILED DESCRIPTION OF PREFERRED EMBODIMENTS

It is to be understood by one skilled in the art that the present discussion is a description of exemplary embodiments only, and is not intended as limiting the broader aspects of the present invention, which broader aspects are embodied in the exemplary constructions.

The present invention provides various surface mount devices having a multilayer structure to achieve desired filter arrangements. For example, capacitors and inductors are located on the same chip to create a variety of LC filters, such as LPF, HPF, BPF and BRF, or combinations of these options, as well as LC resonator structures. The chip is preferably built by thin film technology, which allows a considerable reduction in component or circuit size.

According to an important aspect of the invention, the multiple layers can include capacitance layers, inductance layers and a layer combining both. The filter of the present invention can be employed in various high frequency applications (e.g., above 100 MHz) for cellular phones, paging systems, wireless LANs, and other wireless communication systems.

Referring now to FIG. 1, filter 10 is shown as it may appear when surface mounted to a printed circuit board 12. Often, circuit board 12 may be made from a low-temperature organic material, with the solder often being a low temperature eutectic solder applied by wave, reflow, vapor phase or manual soldering techniques.

As shown, filter 10 includes a device body 14 having a plurality of terminations 16, 18, 20 and 22 thereon. Terminations 16 and 18 are attached to board 12 at respective mounting pads, such as pad 24. Conductive traces, such as trace 26, may be defined on the top surface of circuit board 12 using known microstrip techniques. As shown, the conductive traces extend from a respective mounting pad to provide electrical communication with other circuitry. In this case, termination 16 is the device input, with the device output being termination 18. Terminations 20 and 22 are attached to a single mounting pad 28 which is electrically connected to ground plane 30 through vias 32 and 34.

Figure 2:
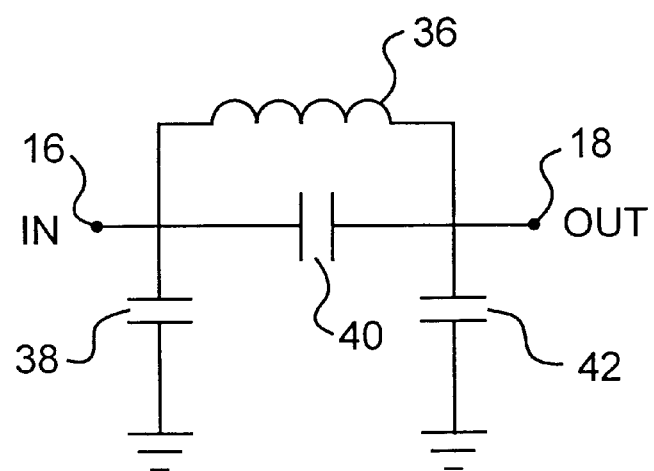
FIG. 2 is a schematic diagram of one preferred circuit arrangement in a filter device of the present invention.

FIG. 2 illustrates one filter arrangement, such as a LPF, including an inductor coil 36 and a plurality of capacitors, indicated at 38, 40 and 42. In this case, inductor coil 36 and capacitor 40 are connected in parallel between input termination 16 and output termination 18. Capacitors 38 and 42 are connected between ground and the respective terminations 16 and 18.

Figure 3:
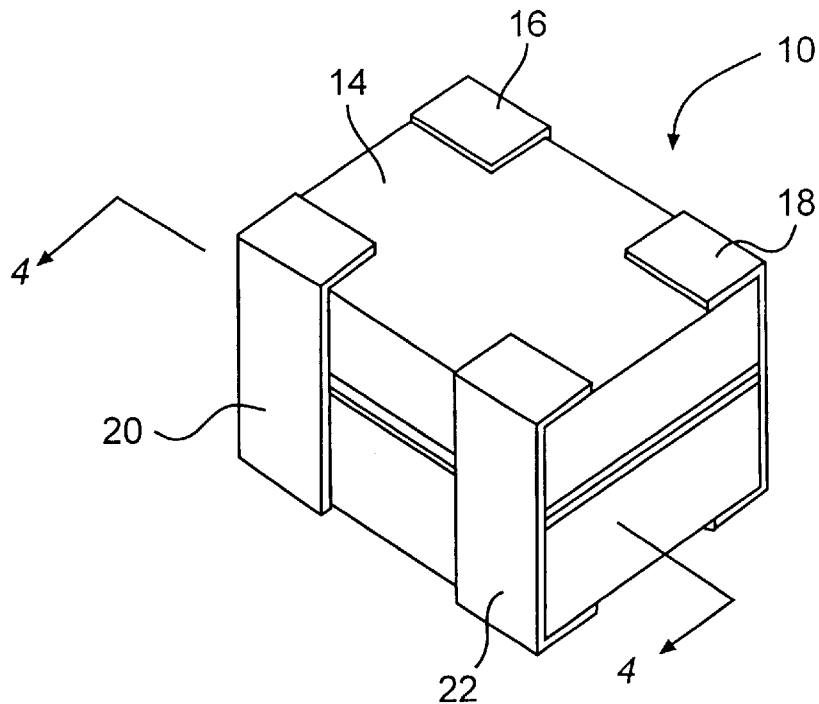
FIG. 3 is an enlarged perspective view of the filter device of FIG. 1.

Referring now to FIG. 3, device body 14 will often be rectangular, defining a longer length dimension and a shorter width dimension. Preferably, device body 14 is sized to conform to a standard size for other small surface mount components, such as multilayer ceramic capacitors. According to industry practice, the size of a such a component is generally expressed as a number "XXYY," with XX and YY being the length and width, respectively, in hundredths of an inch. A typical size under this practice is 0805.

Figure 4:
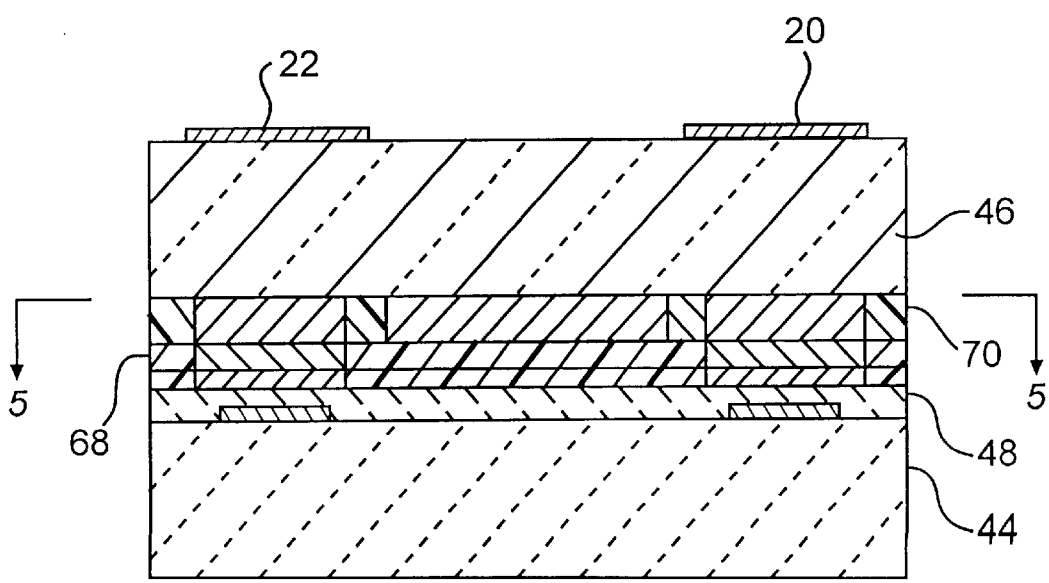
FIG. 4 is a cross sectional view as taken along line 4—4 of FIG. 3.

Referring to FIG. 4, device body 14 includes an insulating substrate 44, which is preferably formed of alumina or a like rigid material. For example, a glazed alumina substrate may be utilized for this purpose. A plurality of layers alternately provide patterned conductors as necessary to achieve the desired filtering function. A sealing cover 46, which is preferably made from glass, glass-ceramic, alumina or a similar rigid insulative material, is located above the alternating layers. A suitable polymer material, such as polyimide, can be used as the sealing cover in some embodiments. This is particularly desirable in flip chip versions of the device.

Figure 5:
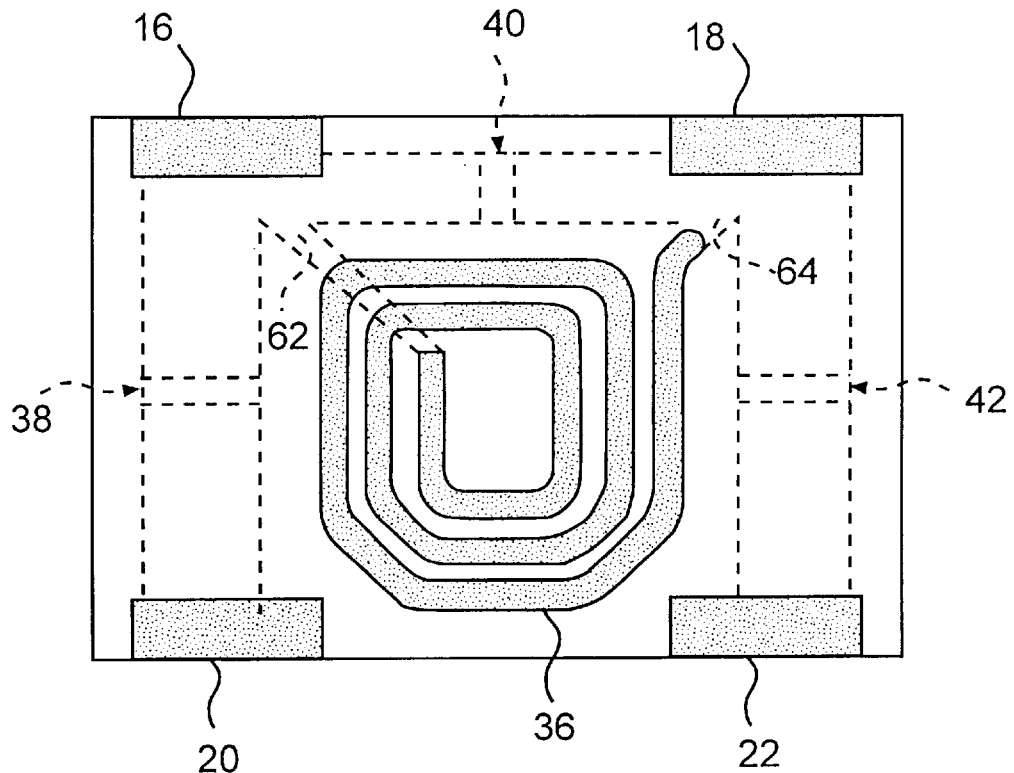
FIG. 5 is a plan view taken along line 5—5 of FIG. 4 showing one preferred conductor layout in a filter device of the present invention.

FIG. 5 shows the circuit arrangement of FIG. 2 as it may appear when built into a filter of the present invention. As can be seen, capacitors 38, 40 and 42 are formed under the layer in which most of inductor coil 36 is located. As will be apparent to one skilled in the art, each of the capacitors 38, 40 and 42 is actually formed as two capacitors that are serially connected by a common bottom electrode plate. It can be seen that respective ends of the upper layer portion of inductor coil 36 register with conductors underneath to provide electrical communication with terminations 16 and 18.

Figure 6A:
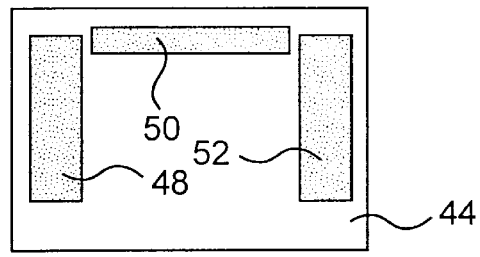
FIGS. 6A through 6F are plan views showing sequentially formed layers to produce the conductor layout of FIG. 5.

The manner in which the conductors of the filter device are formed will now be described with reference to FIGS. 6A through 6F. As shown in FIG. 6A, a first conductive pattern, here defining a plurality of capacitor plates 48, 50 and 52 is formed on the top surface of substrate 44. Generally, capacitor plates 48, 50 and 52 will be very thin and may be defined using known photolithographic techniques. In a preferred embodiment, capacitor plates 48, 50 and 52 are formed of aluminum having a thickness of about 2 microns. This layer can be referred to as "Pad I."

Figure 6B:
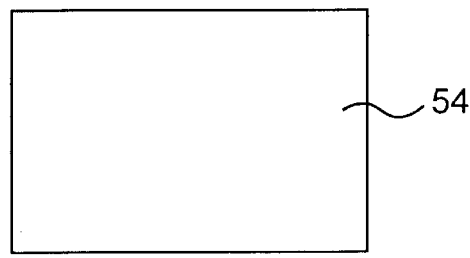

Referring now to FIG. 6B, a dielectric layer 54, such as SiNO or $SiO_2$, is next deposited coextensive with the top surface of substrate 44. As a result, dielectric layer 54 will cover the first conductive pattern on substrate 44. In a preferred embodiment, a dielectric thickness of about 1.65 microns is applied in this manner.

Figure 6C:
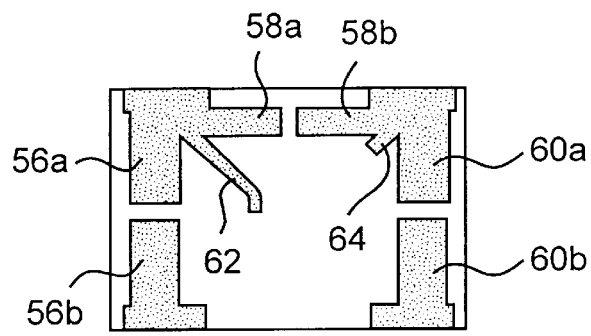

As shown in FIG. 6C, a second conductive pattern is then formed, preferably by photolithography, above dielectric layer 54. As can be seen, the second conductive pattern defines capacitor plate structures 56a–56b, 58a–58b and 60a–60b overlying respective capacitor plates 48, 50 and 52. The second conductive pattern further defines inductor coil interconnects, indicated at 62 and 64. This layer, which may have a conductor thickness of about 2 microns in preferred embodiments, may be referred to as "Pad II."

At least two insulative layers, which may be made from polyimide or a similar polymeric material, are disposed over the second conductive pattern. For example, a photoimageable polyimide may be practiced. The embodiment of FIG. 4 includes two polymer layers, respectively indicated as 66 and 68. These layers, which are respectively shown in FIGS. 6D and 6F, may be referred to as "Poly I" and "Poly II".

The polymer insulative layers define conductor channels in register with certain portions of underlying thin film conductors. The conductor channels are filled, such as electroplating, to thicken the inductor coil pattern, as well as to provide connections to terminations on the side of the device. For example, polymer layers of at least 15 microns, and preferably about 25 microns, can be utilized to provide conductors of like thickness.

Figure 6D:
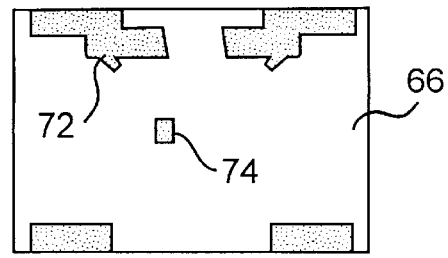

As can be seen in FIG. 6D, the conductor channel overlying interconnect 62 is discontinuous, leaving a short stub portion 70 and a via conductor 72. As a result, an insulative bridge is provided at the location where turns of the overlying coil pattern will cross. Electrical connection to the coil is maintained through thin layer interconnect 62.

Figure 6E:
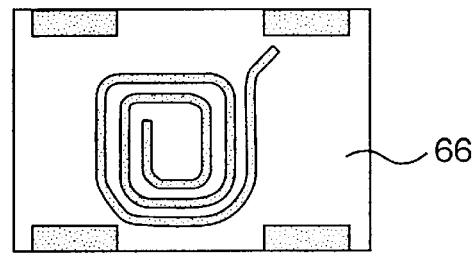
Figure 6F:
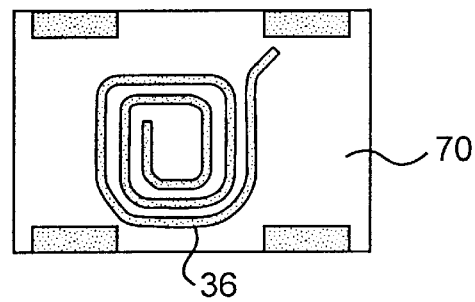

FIG. 6E shows the thin layer pattern ("Pad III") that is next formed over layer 66. As shown, the pattern is that of the top layer inductor coil. Final polymer layer 68 (FIG. 6F) defines a conductor channel in register with this pattern in which a thickened conductor is provided by electroplating or other suitable means as described above.

Figure 7:
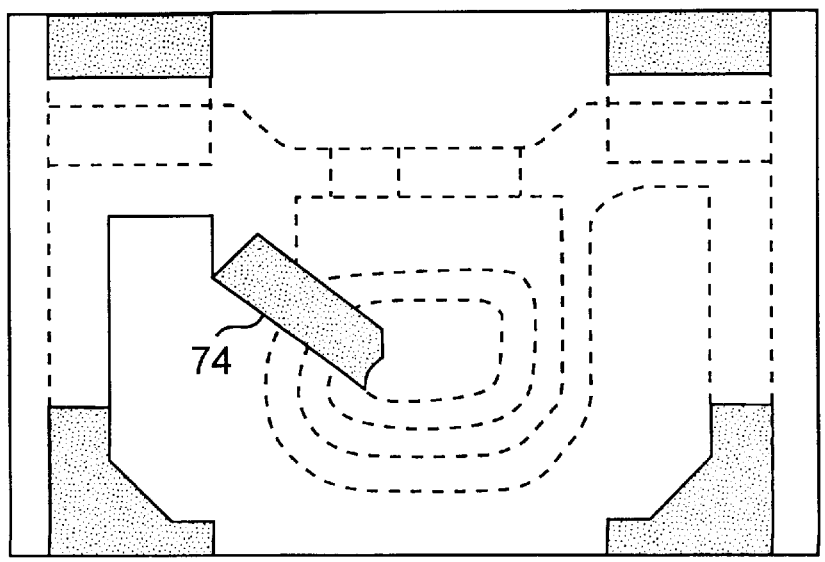
FIG. 7 is a plan view taken similar to FIG. 5 showing an alternative conductor layout in a filter device of the present invention.

One skilled in the art will appreciate that various alternative layer constructions, as well as various circuit arrangements, can be achieved according to the teachings of the present invention. For example, FIG. 7 illustrates an alternative filter 10' wherein the coil pattern 36' is located below the top conductor layer. This embodiment may be particularly useful in higher frequency applications, such as 1900 or 2400 MHz. The embodiment of FIG. 5, in contrast, may be particularly useful in lower frequency applications, such as 900 MHz.

One or more interconnects, such as interconnect 74, may be located on the layer immediately below the sealing cover. Interconnect 74 functions to electrically connect one end of coil pattern 36' with the node between capacitors 40' and 42'.

The various layers of this embodiment can be easily understood with reference to FIGS. 7A through 7F.

Figure 7A:
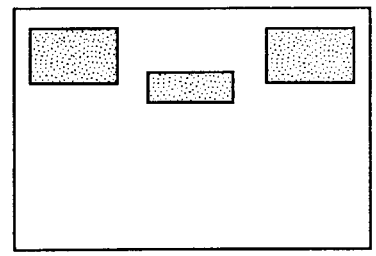
FIGS. 7A through 7F are plan views showing sequentially formed layers to produce the conductor layout of FIG. 7.
Figure 7B:
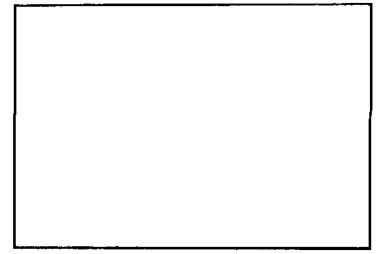
Figure 7C:
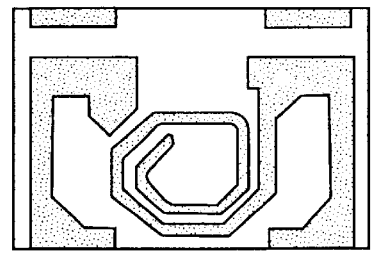

As shown in FIG. 7A, the first conductive pattern is located on the top surface of substrate 44', here defining a plurality of capacitor plates 48', 50' and 52'. Next, as shown in FIG. 7B, a dielectric layer 54 is deposited coextensive with the top surface of substrate 44'. A second conductive pattern as shown in FIG. 7C ("Pad II") is then formed above dielectric layer 54'. It can be seen that this conductive pattern defines capacitor plate structures 56a'–56b', 58a'–58b and 60a'–60b' overlying respective capacitor plates 48', 50' and 52'. The second conductive pattern further defines much of inductor coil 36'.

Figure 7D:
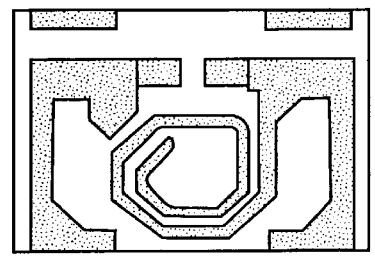
Figure 7E:
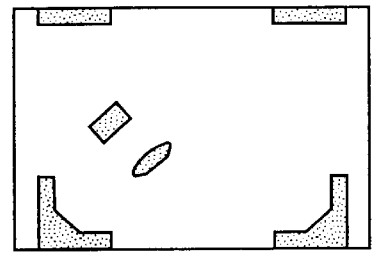

Referring now to FIG. 7D, the next layer is an insulative layer 66' (" Poly I") of a suitable polymeric material as described above. Conductor channels in layer 66' expose portions of the second conductive pattern which may be filled, such as by electroplating, to enhance the conductor thickness. As shown in FIG. 7E, a further insulative layer 68' is then applied over layer 66' and the enhanced thickness conductors located in the conductor channels thereof.

Figure 7F:
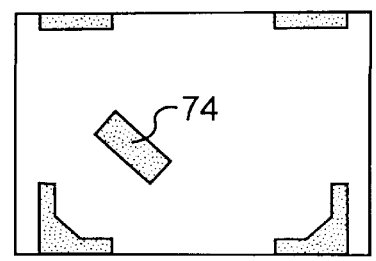

As shown in FIG. 7F, interconnect element 74 is applied as a third conductive layer above the surface of insulative layer 68'. Via conductors 76 and 78 may be provided in the Poly II layer to permit electrical communication with interconnect elements 74. The device may then be covered by an appropriate sealing cover such as that illustrated in relation to the previous embodiment.

Figure 8:
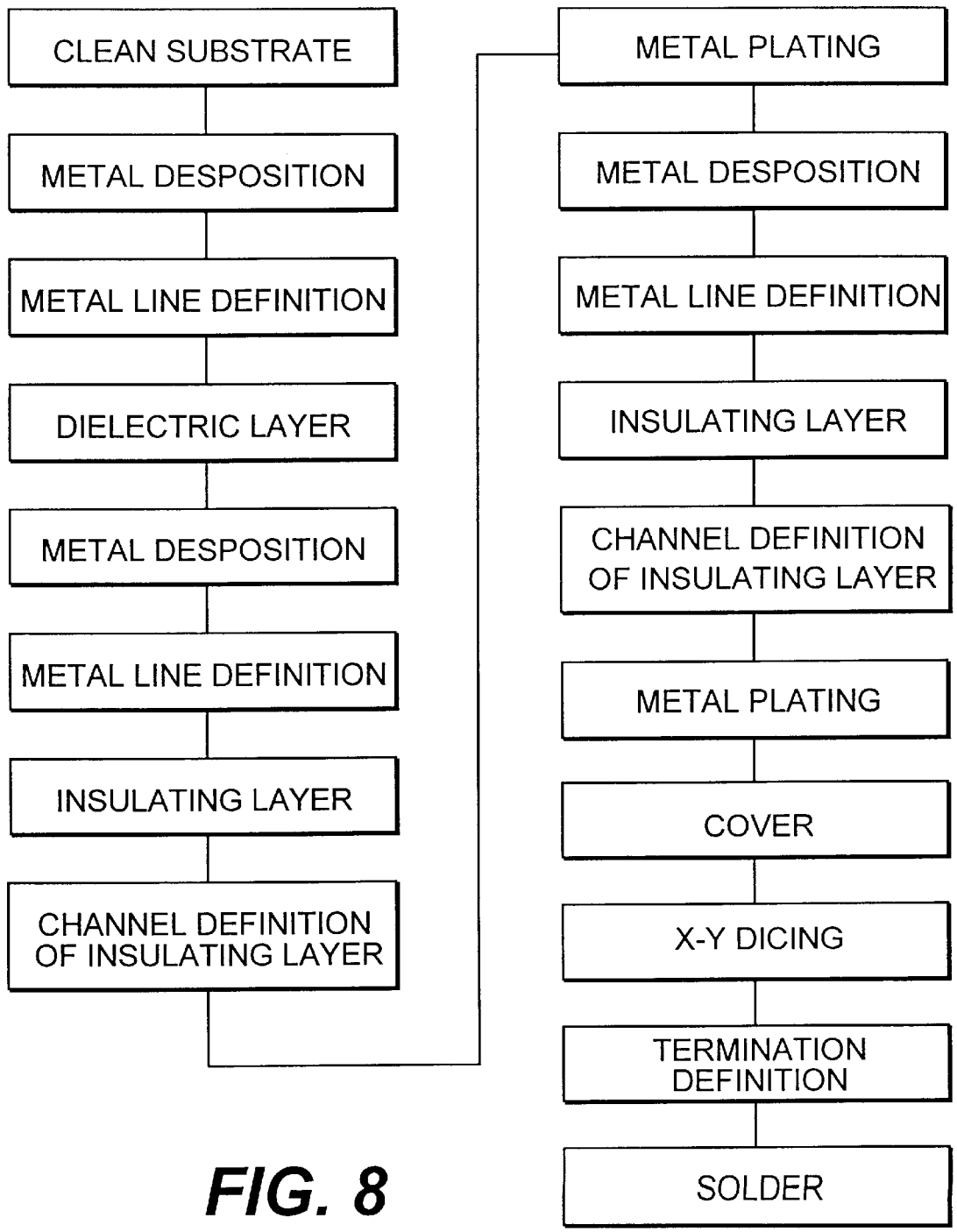
FIG. 8 is a flow chart showing preferred methodology for the manufacture of a surface mount filter as in FIG. 3.

Often, filter devices of the present invention will be one of many manufactured in a larger sheet. The terminations may be applied after dicing of the larger sheet into individual components. A preferred manufacturing process for a component covered by glass or the like is shown in FIG. 8. Similarly, FIG. 9 illustrates a preferred manufacturing process for a flip chip component covered, for example, with polyimide or another such polymer.

Thus, referring to FIG. 8, production of a glass-covered component begins by appropriate cleaning of the substrate. After deposition of metal on the substrate, metal lines of the first conductive pattern are defined. A dielectric layer is disposed over the first conductive pattern, which is then covered with another layer of metal. An insulating layer of polymer is then applied in which appropriate conductor channels are defined. Metal is plated in the conductor channels to enhance the conductor thickness. A further metal layer is then disposed over the insulating layer, in which metal lines are defined. A further insulating layer of polymer is applied, in which conductor channels are then defined. An additional layer of metal plating is applied before application of the sealing cover.

At this point, a multiplicity of devices have been produced in a larger sheet. The larger sheet is then diced in both X and Y directions to yield individual components. The individual components are terminated to form surface mount devices by termination definition, followed by application of solder.

Figure 9:
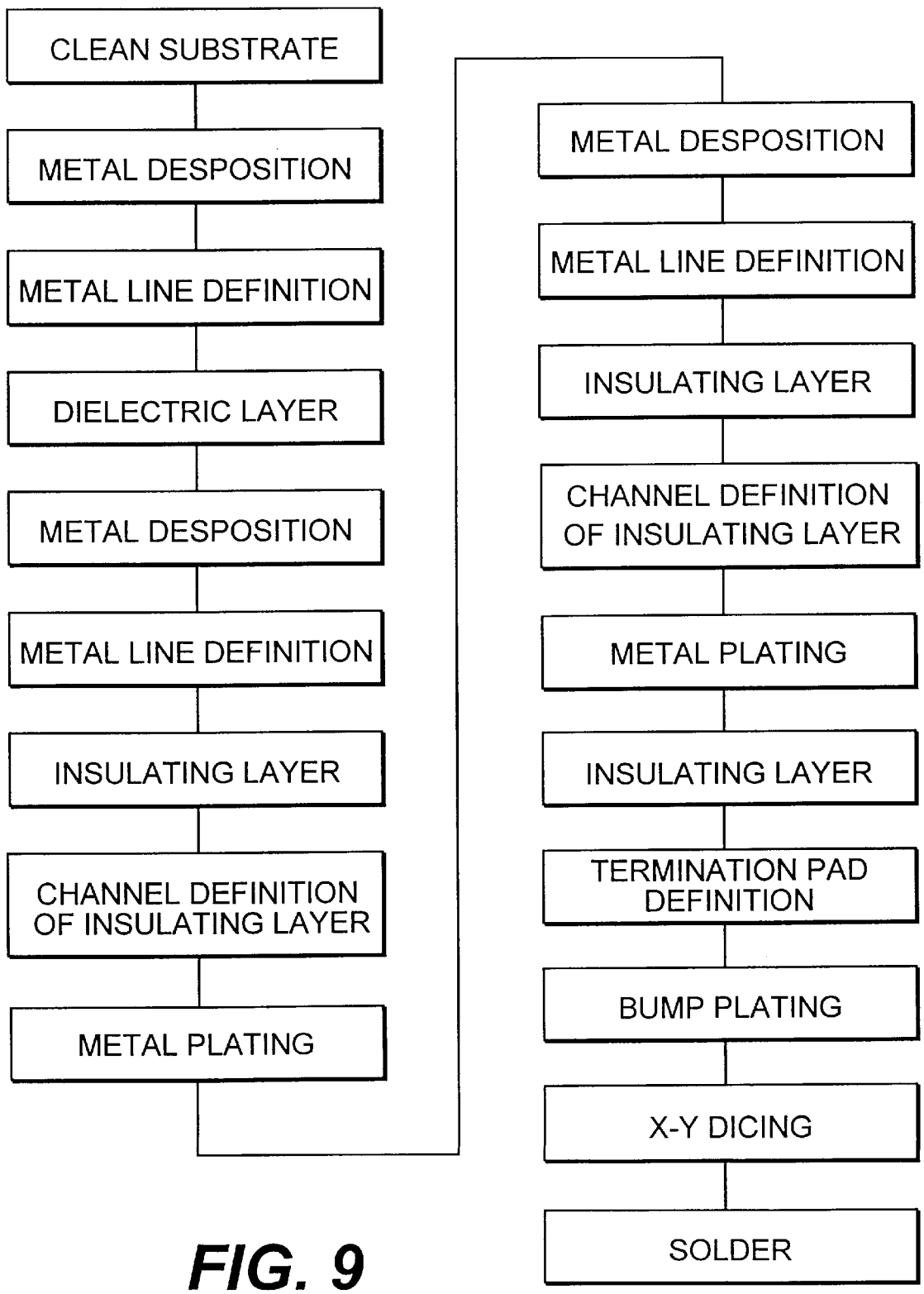
FIG. 9 is a flow chart similar to FIG. 8 showing preferred methodology for producing a flip chip component.

Referring to FIG. 9, it can be seen that many steps in the production of a flip chip component are similar to the production of a covered component. After the second "metal plating" step, however, a further insulating layer is applied. Termination pads are defined on the surface of the insulating layer. After bump plating, the sheet is diced in both X and Y directions to form the individual components. Finally, solder is applied to the individual components.

Figure 10:
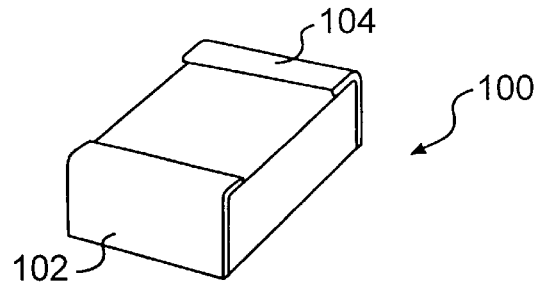
FIG. 10 is a perspective view of a resonator device constructed in accordance with the present invention.
Figure 11:
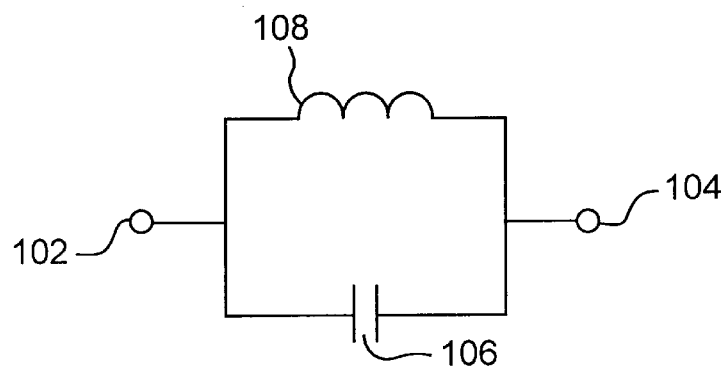
FIG. 11 is a schematic diagram of one preferred circuit arrangement in the resonator device of FIG. 10.

FIG. 10 illustrates a resonator device 100 constructed in accordance with the present invention. Unlike the filters shown above, resonator 100 has only two terminations, indicated at 102 and 104. Referring now to FIG. 11, resonator 100 preferably includes at a capacitor 106 and an inductor 108. Capacitor 106 and inductor 108 are connected in parallel to resonate at the desired frequency.

Figure 12:
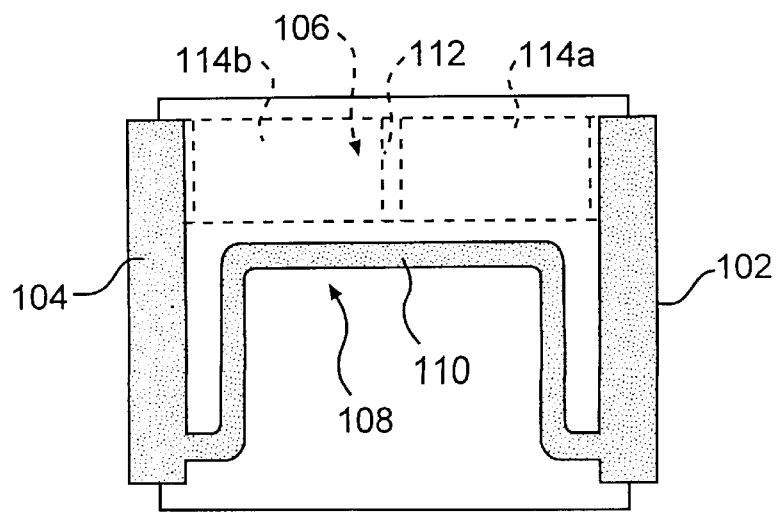
FIG. 12 is a plan view showing one conductor pattern that may be utilized to produce a resonator as in FIG. 10.

FIG. 12 illustrates the conductor layout in one resonator embodiment of the present invention. As shown, the "inductor" is formed by a circuitous conductor element 110. Capacitor 106 is formed as the series combination of two capacitors produced by lower capacitor plate 112 and two overlying plates 114a–b. Plates 114a–b are connected to a respective of terminals 102 and 104.

As one skilled in the art will recognize, the arrangement of FIG. 12 may be made according to the methodology described above. It will be appreciated that such techniques also permit more elaborate arrangements to be readily produced, one of which is shown in FIG. 13.

Figure 13:
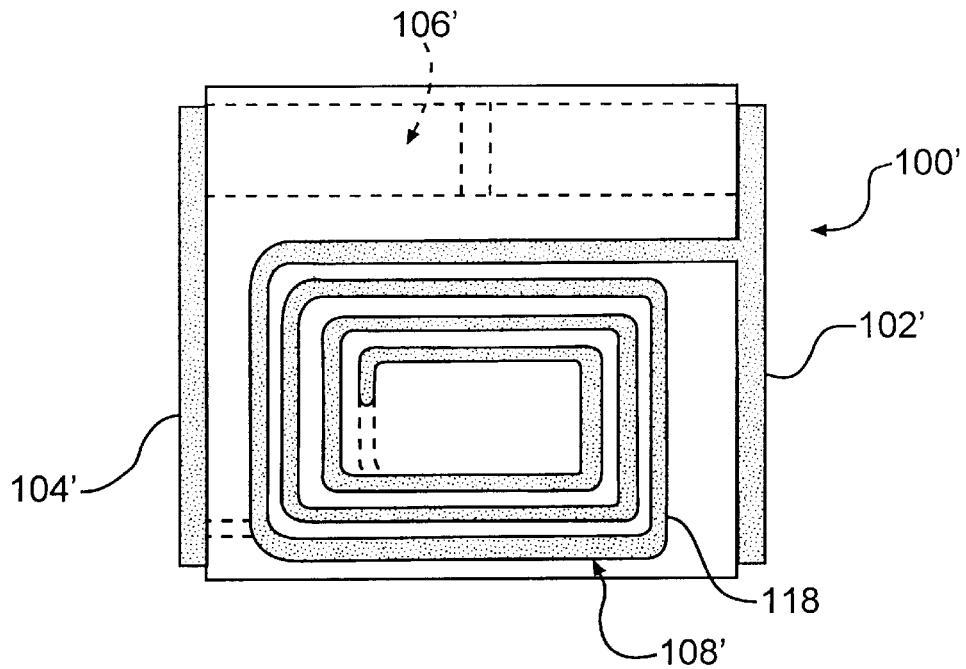
FIG. 13 is a plan view showing another conductor pattern that may be utilized to produce a resonator as in FIG. 10.

In particular, FIG. 13 shows a resonator 100' having terminations 102' and 104'. A capacitor 106' is formed as described above. In this case, however, the inductor, designated 108', has a plurality of turns for enhanced inductance. In particular, a lower layer spiral 116 (FIG. 14D) and an upper layer spiral 118 (FIG. 14F) are connected together through a via 120 (FIG. 14E).

Figure 14A:
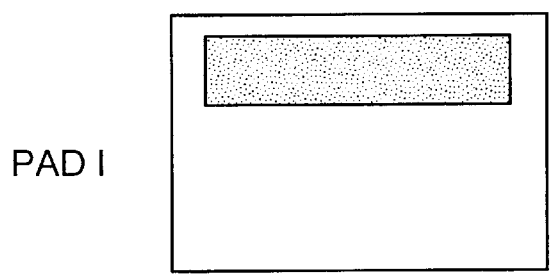
FIGS. 14A through 14F are plan views showing sequentially formed layers to produce the conductor layout of FIG. 13.
Figure 14B:
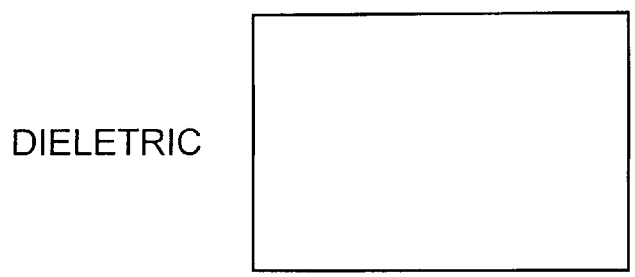
Figure 14C:
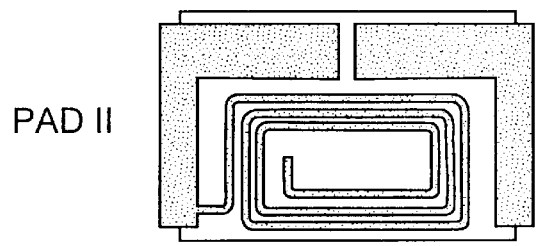
Figure 14D:
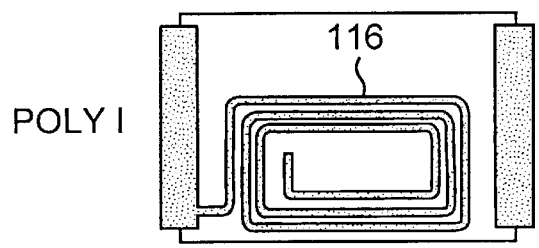
Figure 14E:
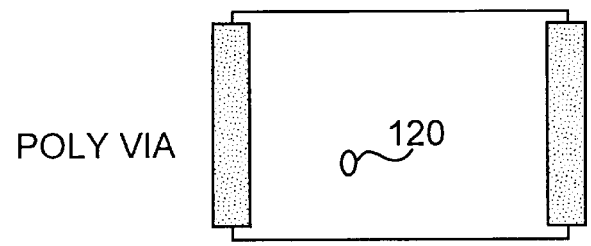

FIGS. 14A through 14F show the formation of individual layers to produce resonator 100'. Referring first to FIG. 14A, a first patterned conductor in the form of a lower capacitor plate 122 is formed on a substrate 124. A dielectric layer 126, coextensive with the upper surface of substrate 124, is then applied as shown in FIG. 14B. Next, as shown in FIG. 14C, a second patterned conductive layer is applied. The second patterned conductive layer includes portions 128a and 128b forming upper capacitor plates. As described above with respect to other embodiments, the capacitor 106' is actually the equivalent capacitor realized by a pair of actual capacitors connected in series. The lower coil portion 116 is located adjacent to the capacitor electrodes, as shown.

Referring now to FIG. 14D, a first layer of insulative polymer ("Poly I") is then located above the second conductive pattern. Channels are formed in insulative layer 130 to expose portions of the second conductive pattern as shown. The channels are filled with additional conductive material to enhance the conductor thickness at these locations. Another insulative layer 132 is then applied, as shown in FIG. 14E, in a manner that exposes via 120.

Figure 14F:
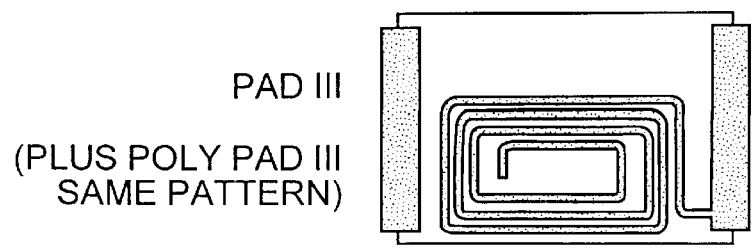
Figure 15:
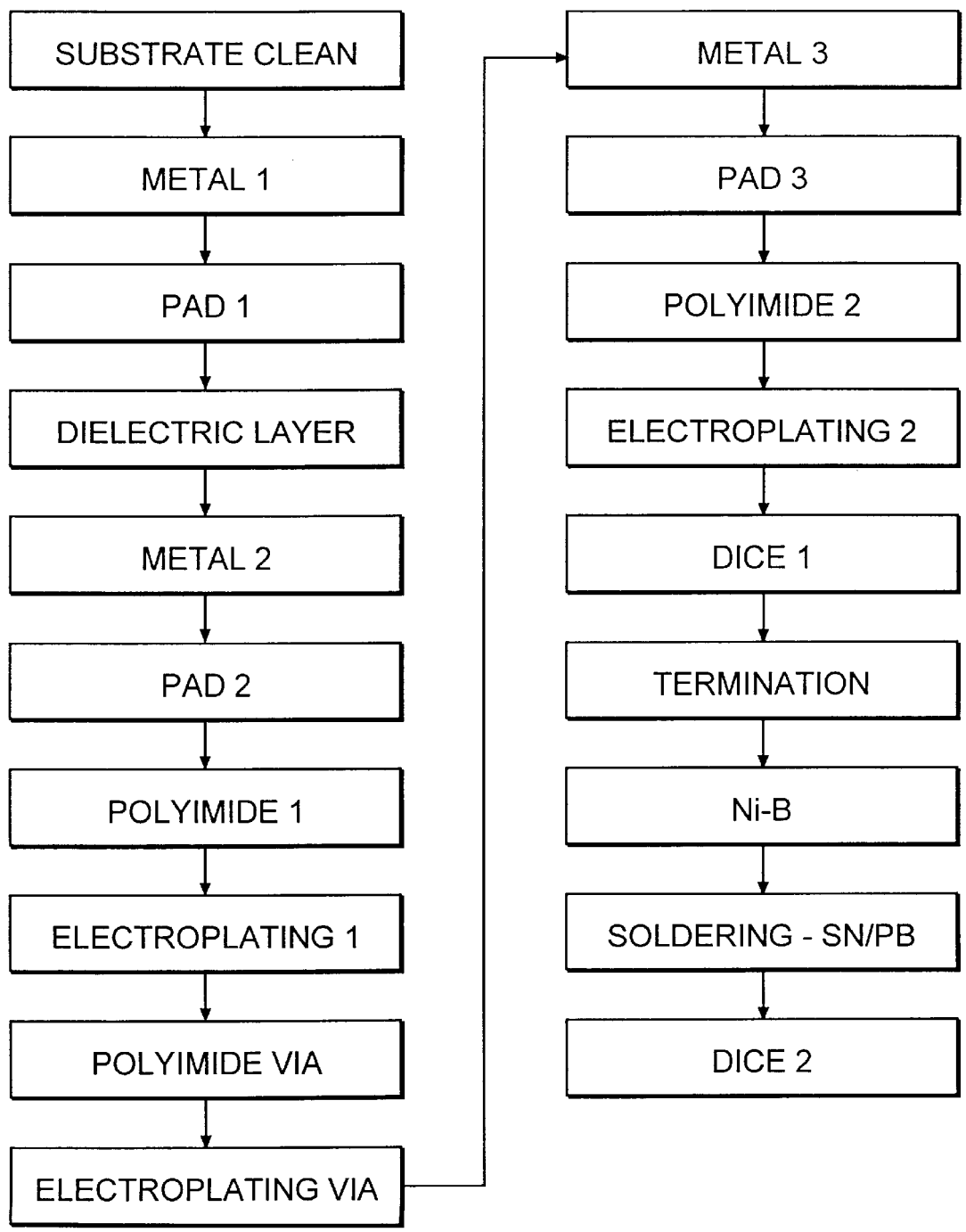
FIG. 15 is a flow chart showing preferred methodology for the manufacture of a surface mount resonator as in FIG. 13.

Referring now to FIG. 14F, a third conductive pattern may then be formed on top of insulative layer 132. An additional insulative layer 134 is then provided, having conductor channels in registry with upper layer spiral 118. The conductor channels are filled with additional conductive material to enhance the conductor thickness as described above. The methodology of producing a resonator as described is also shown in the flow diagram of FIG. 15.

Some of the techniques by which conductors are formed in filter devices of the present invention may be the same as, or analogous to, the techniques described in U.S. Pat. No. 5,363,080 to Breen. Accordingly, this patent is incorporated herein by reference.

It can be seen that the present invention provides various novel filter structures adapted for use as surface mount components. While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention, which is further described in the appended claims.

What is claimed is:

1. A surface mount filter device comprising a device body including a plurality of electrical terminations located thereon, said device body including:
   an insulating substrate having a top surface and a bottom surface;
   a first conductive pattern in the form of at least one first capacitor plate defined on a top surface of the substrate;
   a dielectric layer located on top of the conductive pattern;
   a second conductive pattern located on said dielectric layer, said second conductive pattern defining at least one second capacitor plate in registry with said first capacitor plate to produce a capacitor device, said second conductive pattern further defining at least a portion of an inductor coil;
   a first layer of insulative polymer located above the dielectric layer and a first layer conductor channel in registry with said portion of said inductor coil, said first layer conductor channel containing a conductive material; and
   an insulative cover layer.

2. A surface mount filter device as set forth in claim 1, further comprising a second layer of insulative polymer located above said first layer of insulative polymer.

3. A surface mount filter device as set forth in claim 2, wherein said second layer of insulative polymer defines a second layer conductor channel containing conductive material defining an inductor coil.

4. A surface mount filter device as set forth in claim 2, wherein said second layer of insulative polymer defines a second layer conductor channel containing conductive material defining an interconnect for said first layer conductor channel.

5. A surface mount filter device as set forth in claim 1, wherein said insulative polymer is a photoimageable polyimide.

6. A surface mount filter device as set forth in claim 1, wherein said sealing cover is formed from a planar sheet of insulative polymeric material.

7. A surface mount filter device comprising a device body including a plurality of electrical terminations located thereon, said device body including:
   an insulating substrate having a top surface and a bottom surface;
   a first conductive pattern in the form of at least one first capacitor plate defined on a top surface of the substrate;
   a dielectric layer located on top of the conductive pattern;
   a second conductive pattern located on said dielectric layer, said second conductive pattern defining at least one second capacitor plate in registry with said first capacitor plate to produce a capacitor device, said second conductive pattern further defining at least a portion of an inductor coil;
   a first layer of insulative polymer located above the dielectric layer and a first layer conductor channel in registry with said portion of said inductor coil, said first layer conductor channel containing a conductive material; and
   an insulative cover layer, wherein said dielectric layer comprises a thin layer dielectric material selected from a group consisting of SiNO and $SiO_2$.

8. A surface mount filter device comprising a device body including a plurality of electrical terminations located thereon, said device body including:
   an insulating substrate having a top surface and a bottom surface;
   a first conductive pattern in the form of at least one first capacitor plate defined on a top surface of the substrate;
   a dielectric layer located on top of the conductive pattern;
   a second conductive pattern located on said dielectric layer, said second conductive pattern defining at least one second capacitor plate in registry with said first capacitor plate to produce a capacitor device, said second conductive pattern further defining at least a portion of an inductor coil;
   a first layer of insulative polymer located above the dielectric layer and a first layer conductor channel in registry with said portion of said inductor coil, said first layer conductor channel containing a conductive material; and
   an insulative cover layer, wherein said sealing cover is formed from a rigid insulative material selected from a group consisting of glass, glass-ceramic and alumina.

9. A surface mount filter device comprising a device body including a plurality of electrical terminations located thereon, said device body including:
   an insulating substrate having a top surface and a bottom surface;
   a first conductive pattern in the form of at least one first capacitor plate defined on a top surface of the substrate;
   a dielectric layer located on top of the conductive pattern;
   a second conductive pattern located on said dielectric layer, said second conductive pattern defining at least one second capacitor plate in registry with said first capacitor plate to produce a capacitor device, said second conductive pattern further defining at least a portion of an inductor coil;
   a first layer of insulative polymer located above the dielectric layer and a first layer conductor channel in registry with said portion of said inductor coil, said first layer conductor channel containing a conductive material; and
   an insulative cover layer, wherein said at least one first capacitor plate is not directly connected with any of said terminations.

10. A surface mount filter device comprising a device body including a plurality of electrical terminations located thereon, said device body including:
    an insulating substrate having a top surface and a bottom surface;
    a first conductive pattern in the form of at least one first capacitor plate defined on a top surface of the substrate;
    a dielectric layer located on top of the conductive pattern;
    a second conductive pattern located on said dielectric layer, said second conductive pattern defining at least one second capacitor plate in registry with said first capacitor plate to produce a capacitor device, said second conductive pattern further defining at least a portion of an inductor coil;
    a first layer of insulative polymer located above the dielectric layer and a first layer conductor channel in registry with said portion of said inductor coil, said first layer conductor channel containing a conductive material; and
    an insulative cover layer, wherein each of said second capacitor plates comprises a pair of second capacitor electrodes disposed over a respective at least one of said first capacitor plates to produce a respective equivalent capacitor element.

11. A surface mount filter device as set forth in claim 10, wherein said first conductive pattern defines at least three of said first capacitor plates, each being superposed by a respective pair of said second capacitor electrodes to produce at least three of said equivalent capacitor elements.

12. A surface mount filter device as set forth in claim 11, comprising at least four of said terminations located on lateral sides of said device body.

13. A surface mount filter device as set forth in claim 12, wherein:

a first equivalent capacitor element is electrically connected between a first termination and a second termination;

a second equivalent capacitor element is electrically connected between said first termination and a third termination; and a third equivalent capacitor element is electrically connected between said second termination and a fourth termination.

14. A surface mount filter device as set forth in claim 13, wherein said inductor is electrically connected between said first termination and said second termination.

* * * * *